United States Patent
Otake et al.

(10) Patent No.: US 8,698,064 B2
(45) Date of Patent: Apr. 15, 2014

(54) SOLID-STATE IMAGING DEVICE

(71) Applicant: Panasonic Corporation, Osaka (JP)

(72) Inventors: Yusuke Otake, Toyama (JP); Yutaka Hirose, Kyoto (JP); Mitsuyoshi Mori, Kyoto (JP); Toru Okino, Osaka (JP); Yoshihisa Kato, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/681,471

(22) Filed: Nov. 20, 2012

(65) Prior Publication Data

US 2013/0075591 A1 Mar. 28, 2013

Related U.S. Application Data

(63) Continuation of application No. PCT/JP2011/002554, filed on May 6, 2011.

(30) Foreign Application Priority Data

May 28, 2010 (JP) ................................. 2010-123387

(51) Int. Cl.
*H01L 27/00* (2006.01)
*H01L 31/0203* (2006.01)

(52) U.S. Cl.
USPC ....................................... 250/208.1; 257/434

(58) Field of Classification Search
CPC ................... H01L 27/14601; H01L 27/14621; H01L 27/14623
USPC ................................. 250/208.1; 257/432, 434
See application file for complete search history.

(56) References Cited

U.S. PATENT DOCUMENTS

| | | | |
|---|---|---|---|
| 6,396,118 B1 | 5/2002 | Theil et al. | |
| 6,730,900 B2 | 5/2004 | Hsish et al. | |
| 6,852,562 B1* | 2/2005 | Hopper et al. | 438/57 |
| 7,701,029 B2 | 4/2010 | Mabuchi | |
| 7,795,676 B2 | 9/2010 | Mabuchi | |
| 7,968,888 B2 | 6/2011 | Yamaguchi et al. | |

(Continued)

FOREIGN PATENT DOCUMENTS

| | | |
|---|---|---|
| JP | 62-092365 | 4/1987 |
| JP | 10-209412 | 8/1998 |

(Continued)

OTHER PUBLICATIONS

International Search Report issued Jul. 19, 2011 in International (PCT) Application No. PCT/JP2011/002554.

*Primary Examiner* — Thanh Luu
(74) *Attorney, Agent, or Firm* — Wenderoth, Lind & Ponack, LLP.

(57) ABSTRACT

A solid-state imaging device according to the present invention includes pixels which are arranged two-dimensionally and each of which includes: a light absorbing layer that converts light into signal charges; a signal read circuit to read out the signal charges, the signal read circuit being formed on a side opposite to a light incident plane side of the light absorbing layer; a metal layer that is formed on the light incident plane side of the light absorbing layer, the metal layer having an aperture to transmit, into the light absorbing layer, light of a wavelength range depending on a shape of the aperture, a driving circuit that applies a voltage to the metal layer to generate, in the light absorbing layer, a potential gradient to collect the signal charges.

13 Claims, 12 Drawing Sheets

(56) References Cited

U.S. PATENT DOCUMENTS

| | | |
|---|---|---|
| 8,030,720 B2 | 10/2011 | Mabuchi |
| 8,054,356 B2 | 11/2011 | Ota |
| 8,084,837 B2 | 12/2011 | Mabuchi |
| 8,188,522 B2 | 5/2012 | Mabuchi |
| 8,198,694 B2 | 6/2012 | Mabuchi |
| 8,198,695 B2 | 6/2012 | Mabuchi |
| 2003/0214595 A1 | 11/2003 | Mabuchi |
| 2005/0133879 A1 | 6/2005 | Yamaguti et al. |
| 2006/0125038 A1 | 6/2006 | Mabuchi |
| 2006/0278948 A1 | 12/2006 | Yamaguchi et al. |
| 2008/0211954 A1 | 9/2008 | Ota |
| 2010/0127342 A1 | 5/2010 | Mabuchi |
| 2010/0194943 A1 | 8/2010 | Mabuchi |
| 2010/0194950 A1 | 8/2010 | Mabuchi |
| 2011/0084317 A1 | 4/2011 | Mabuchi |
| 2011/0084351 A1 | 4/2011 | Mabuchi |
| 2011/0084352 A1 | 4/2011 | Mabuchi |
| 2011/0086463 A1 | 4/2011 | Mabuchi |
| 2011/0266598 A1 | 11/2011 | Mabuchi |

FOREIGN PATENT DOCUMENTS

| | | |
|---|---|---|
| JP | 2003-338615 | 11/2003 |
| JP | 2005-019958 | 1/2005 |
| JP | 2005-347475 | 12/2005 |
| JP | 2006-024832 | 1/2006 |
| JP | 2006-173351 | 6/2006 |
| JP | 2006-344754 | 12/2006 |
| JP | 2007-059457 | 3/2007 |
| JP | 2008-228265 | 9/2008 |
| JP | 2009-004550 | 1/2009 |
| JP | 2001-257336 | 9/2011 |

* cited by examiner

SOLID-STATE IMAGING DEVICE

CROSS REFERENCE TO RELATED APPLICATIONS

This is a continuation application of PCT Patent Application No. PCT/JP2011/002554 filed on May 6, 2011, designating the United States of America, which is based on and claims priority of Japanese Patent Application No. 2010-123387 filed on May 28, 2010. The entire disclosures of the above-identified applications, including the specifications, drawings and claims are incorporated herein by reference in their entirety.

FIELD

The present invention relates to solid-state imaging devices and, in particular, to a solid-state imaging device having pixels arranged two-dimensionally.

BACKGROUND

Solid-state imaging devices are used for, for example, cameras for cellular phones, digital still cameras (DSCs), and high definition (HD) movie cameras, as a device to obtain the image information of an object.

Moreover, in a solid-state imaging device, unit pixels having photodiodes are arranged in an array on a silicon semiconductor substrate. Moreover, a microlens provided above a photodiode collects light from an object and the photodiode receives the collected light. Moreover, a signal read circuit outputs signal charges generated by photoelectric conversion at the photodiode. Through a series of these operations, the solid-state imaging device can obtain image information.

When such a solid-state imaging device captures color images, a color filter is provided between the photodiode of each pixel and a microlens. This color filter transmits only the light of a desired wavelength range among incident light from an object. The solid-state imaging device receives light of the desired wavelength range at the photodiode, and performs arithmetic processing, based on an obtained signal output, thereby obtaining a color image. A fine particle pigment filter is generally used for this color filter. Moreover, for good color separation, this color filter requires a film thickness of around 1 μm.

On the other hand, pixels have been microfabricated in recent years in order to achieve smaller solid-state imaging devices and higher resolution of captured images. For instance, solid-state imaging devices having minute pixels of around 1.0 μm have been developed. Following the microfabrication of this pixel size, the light receiving area of a photodiode in a unit pixel, i.e., an aperture ratio has been decreasing. This makes it difficult to maintain high sensitivity at a minute pixel. This also leads to increase in the distance between a microlens and a photodiode, the width of a photodiode, and an aspect ratio. Thus, light collected at the microlens not only enters a photodiode in the same pixel, but also enters a photodiodes in an adjacent pixel. In other words, optical color mixing occurs.

To solve such problems, backside illumination solid-state imaging devices have been in development in which light enters a surface opposite to a surface where a signal read circuit is formed.

Moreover, general backside illumination solid-state imaging devices need to collect electric charges generated in a light receiving part on a side opposite to the side of an illumination surface, i.e., a surface where a signal read circuit is formed.

In the related art shown in Patent Literature 1 discloses a technique by which a transparent electrode is provided on the illumination surface side of the light receiving part in a backside illumination solid-state imaging device, and a potential gradient is generated in the light receiving part by bias to the transparent electrode. Thus, the solid-state imaging device recited in Patent Literature 1 can easily collect electric charges. Indium thin oxide (ITO) is used, for example, in this transparent electrode.

CITATION LIST

Patent Literature

[PTL 1] Japanese Unexamined Patent Application Publication No. 2006-173351.

SUMMARY

Technical Problem

However, in the related art disclosed in Patent Literature 1, when the solid-state imaging device captures color images, a color filter should be formed above the light receiving part. Since this color filter is a thick film, the technique recited in Patent Literature 1 has a problem that a minute pixel has a high aspect ratio. This decreases sensitivity characteristics in the conventional solid-state imaging device. Moreover, oblique incident light that passed through a microlens passes through a color filter to enter adjacent pixels, thereby causing color mixing.

It should be noted that a simple method of forming a light shielding film may be considered as a solution to prevent color mixing. In this case, however, it is difficult to secure an enough amount of light. This is because the aspect ratio further increases by adding the light shielding film.

In view of the above problems, an object of the present invention is to provide a solid-state imaging device that can achieve a low aspect ratio.

Solution to Problem

To achieve the above object, a solid-state imaging device according to an embodiment of the present invention includes: pixels which are arranged two-dimensionally and each of which includes: a light absorbing layer that converts light into signal charges; a signal read circuit that reads out the signal charges, the signal read circuit being formed on a side opposite to a light incident plane side of the light absorbing layer; a metal layer that is formed on the light incident plane side of the light absorbing layer, the metal layer having an aperture to transmit, into the light absorbing layer, light of a wavelength range depending on a shape of the aperture, a driver that applies a voltage to the metal layer to generate, in the light absorbing layer, a potential gradient to collect the signal charges.

This allows a solid-state imaging device according to an embodiment of the present invention to select a wavelength of incident light, using metal films that are used for collecting signal charges generated in light absorbing layers. Thus, since color filters are unnecessary for the solid-state imaging device according to an embodiment of the present invention, a low aspect ratio can be achieved. Therefore, improvement of sensitivity characteristics and suppression of the occurrence of color mixing can be achieved in the solid-state imaging device according to an embodiment of the present invention.

Moreover, the driver may apply a voltage to the metal layer to switch between an accumulation operation, a read operation, and a reset operation for the signal charges.

This allows the solid-state imaging device according to an embodiment of the present invention to select a wavelength of incident light, using a metal layer that is used for switching the operations of a pixel.

Moreover, each of the pixels is one of various types of pixels that convert light of different wavelength ranges into the signal charges, and the shape of the aperture formed in the metal layer may vary according to the types of the pixels.

This allows the solid-state imaging device according to an embodiment of the present invention to adjust a transmitted wavelength band for each pixel. Therefore, good color separation is possible.

Moreover, the aperture may have a tapered shape in a cross section perpendicular to the metal layer.

This allows the solid-state imaging device according to an embodiment of the present invention to easily adjust a transmitted wavelength bandwidth. Therefore, good color separation is possible.

Moreover, each of the pixels may further include a filter that is formed at least above or in the aperture, the filter blocking light of a wavelength range shorter than the wavelength range depending on the shape of the aperture.

This allows the solid-state imaging device according to an embodiment of the present invention to block light on a short-wavelength side in a transmitted wavelength band of incident light. Therefore, good color separation is possible.

Moreover, each of the pixels may further include a microlens formed on the light incident plane side of the aperture, and a focus of the microlens is in the light absorbing layer.

Thus, in the solid-state imaging device according to an embodiment of the present invention, incident light efficiently enters the light absorbing layer. Therefore, sensitivity characteristics can be improved.

Moreover, the solid-state imaging device may include a semiconductor substrate, in which the light absorbing layer may be formed in the semiconductor substrate, the signal read circuit may be formed on a first surface side of the semiconductor substrate, and the metal layer may be formed on a second surface side of the semiconductor substrate opposite to the first surface side, and transmit, into the light absorbing layer, light of the wavelength range depending on the shape of the aperture among incident light from the second surface side.

Thus, the solid-state imaging device according to an embodiment of the present invention can prevent the occurrence of vignetting due to a wiring layer. Moreover, the solid-state imaging device according to an embodiment of the present invention can improve an aperture ratio. Therefore, sensitivity characteristics can be improved.

Moreover, the solid-state imaging device may include a semiconductor substrate, in which the signal read circuit may be formed on a first surface side of the semiconductor substrate, the light absorbing layer may be formed above the signal read circuit and formed on the first surface side, and the metal layer may be formed above the light absorbing layer and formed on the first surface side, and transmit, into the light absorbing layer, light of the wavelength range depending on the shape of the aperture among incident light from the first surface side.

Thus, the solid-state imaging device according to an embodiment of the present invention can improve an aperture ratio. Therefore, sensitivity characteristics can be improved.

Moreover, the solid-state imaging device may include a separation that electrically separates the light absorbing layer included in each of the pixels, from the light absorbing layer included in another one of the pixels, the separation being formed of a material having a refractive index lower than a refractive index of the light absorbing layer.

Thus, it is possible to obtain light confinement effects and guided wave effects of light incident on the light absorbing layers in the solid-state imaging device according to an embodiment of the present invention. Therefore, color mixing can be prevented and sensitivity characteristics can be improved.

Moreover, the light absorbing layer may be formed of a planar organic semiconductor, and the planar organic semiconductor includes organic molecular planes layered horizontally.

Moreover, the solid-state imaging device according to an embodiment of the present invention can improve the light-absorbing efficiency of a light absorbing layer. Therefore, sensitivity characteristics can be improved.

Moreover, the light absorbing layer may be formed of a planar organic molecule semiconductor, and the planar organic molecule semiconductor includes organic molecular planes arranged vertically.

Moreover, the solid-state imaging device according to an embodiment of the present invention can improve the light-absorbing efficiency of a light absorbing layer. Therefore, sensitivity characteristics can be improved.

Moreover, the light absorbing layer may be formed of at least two types of conductive semiconductors having different spectral characteristics.

Moreover, the solid-state imaging device according to an embodiment of the present invention can improve the light-absorbing efficiency of a light absorbing layer. Therefore, sensitivity characteristics can be improved.

Moreover, the light absorbing layer may be formed of at least two types of conductive semiconductors having different spectral characteristics, and a position in the depth direction of a depletion region may vary according to types of the pixels, the depletion region being formed by junctioning the two types of the conducive semiconductors.

This allows the solid-state imaging device according to an embodiment of the present invention to prevent the generation of electric charges due to incident light of a wavelength range that is not the desired wavelength range. Therefore, good color separation is possible.

It should be noted that the present invention not only can be achieved as such a solid-state imaging device, but also may be achieved as a method of fabricating such a solid-state imaging device.

Moreover, the present invention may be achieved as a semiconductor integrated circuit (LSI) that achieves a part or all of the functions of such a solid-state imaging device, or may be achieved as a camera having such a solid-state imaging device.

Advantageous Effects

As mentioned above, the present invention can provide a solid-state imaging device capable of achieving a low aspect ratio.

BRIEF DESCRIPTION OF DRAWINGS

These and other objects, advantages and features of the invention will become apparent from the following description thereof taken in conjunction with the accompanying drawings that illustrate a specific embodiment of the present invention.

DESCRIPTION OF EMBODIMENTS

Embodiments of a solid-state imaging device according to the present invention will be described in detail with reference to the drawings.

Embodiment 1

The solid-state imaging device according to the first embodiment of the present invention has an aperture in a metal layer to generate potential gradient in a light absorbing layer, thereby allowing the metal layer to function as a filter. Thus, the solid-state imaging device according to the first embodiment of the present invention does not need another filter. Therefore, a low aspect ratio can be achieved.

Figure 1:
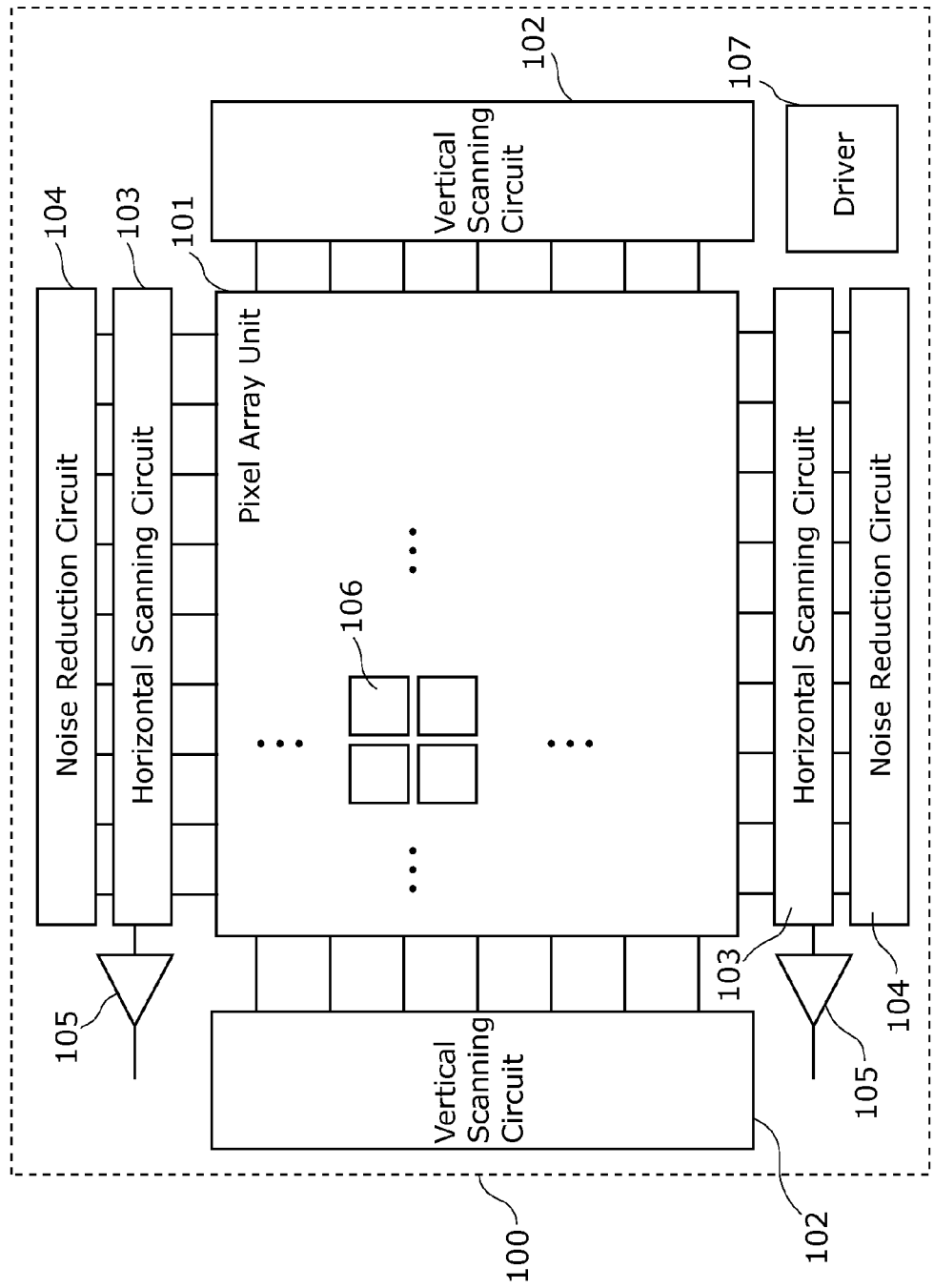
FIG. 1 is a block diagram of a solid-state imaging device according to the first embodiment of the present invention.

FIG. 1 is a block diagram of a solid-state imaging device 100 according to the first embodiment of the present invention. For example, the solid-state imaging device 100 is a stacked MOS solid-state imaging device. It should be noted that whether the solid-state imaging device is a stacked solid-state imaging device or a backside illumination solid-state imaging device, the present invention has similar effects. This will be described later.

The solid-state imaging device 100 shown in FIG. 1 includes a pixel array unit 101, vertical scanning circuits 102, horizontal scanning circuits 103, noise reduction circuits 104, amplifier circuits 105 and a driving circuit 107. Moreover, the pixel array unit 101 includes a plurality of pixels 106 that are arranged in a two-dimensional matrix.

The pixels 106 (unit pixel) each converts incident light into electric signals.

The vertical scanning circuit 102 selects the row of the pixels 106 arranged in rows and columns.

The vertical scanning circuit 103 selects the column of the pixels 106 arranged in rows and columns.

The noise reduction circuit 104 performs noise removal processing for electric signals generated by the pixels 106. For example, the noise reduction circuit 104 performs processing such as correlated double sampling (CDS).

The amplifier circuit 105 amplifies an electric signal converted by the pixels 106 arranged in the row that is selected by the vertical scanning circuit 102 and the column that is selected by the horizontal scanning circuit 103, and outputs the amplified signals to an external device.

The driving circuit 107 controls the operations of the solid-state imaging device 100. Specifically, the driving circuit 107 controls the vertical scanning circuits 102, the horizontal scanning circuits 103, the noise reduction circuits 104, and the amplifier circuits 105 to switch between accumulation operations, read operations, and reset operations. In the accumulation operations, signal charges are accumulated in each pixel 106. In the read operations, electric signals according to signal charges accumulated in each pixel 106 are read out. In the reset operations, electric charges accumulated in each pixel 106 are reset.

It should be noted that FIG. 1 shows an example that the solid-state imaging device 100 includes two vertical scanning circuits 102, two horizontal scanning circuits 103, two noise reduction circuits 104, and two amplifier circuit 105. However, the solid-state imaging device 100 may only include one vertical scanning circuit 102, one horizontal scanning circuit 103, one noise reduction circuit 104, and one amplifier circuit 105.

Figure 2:
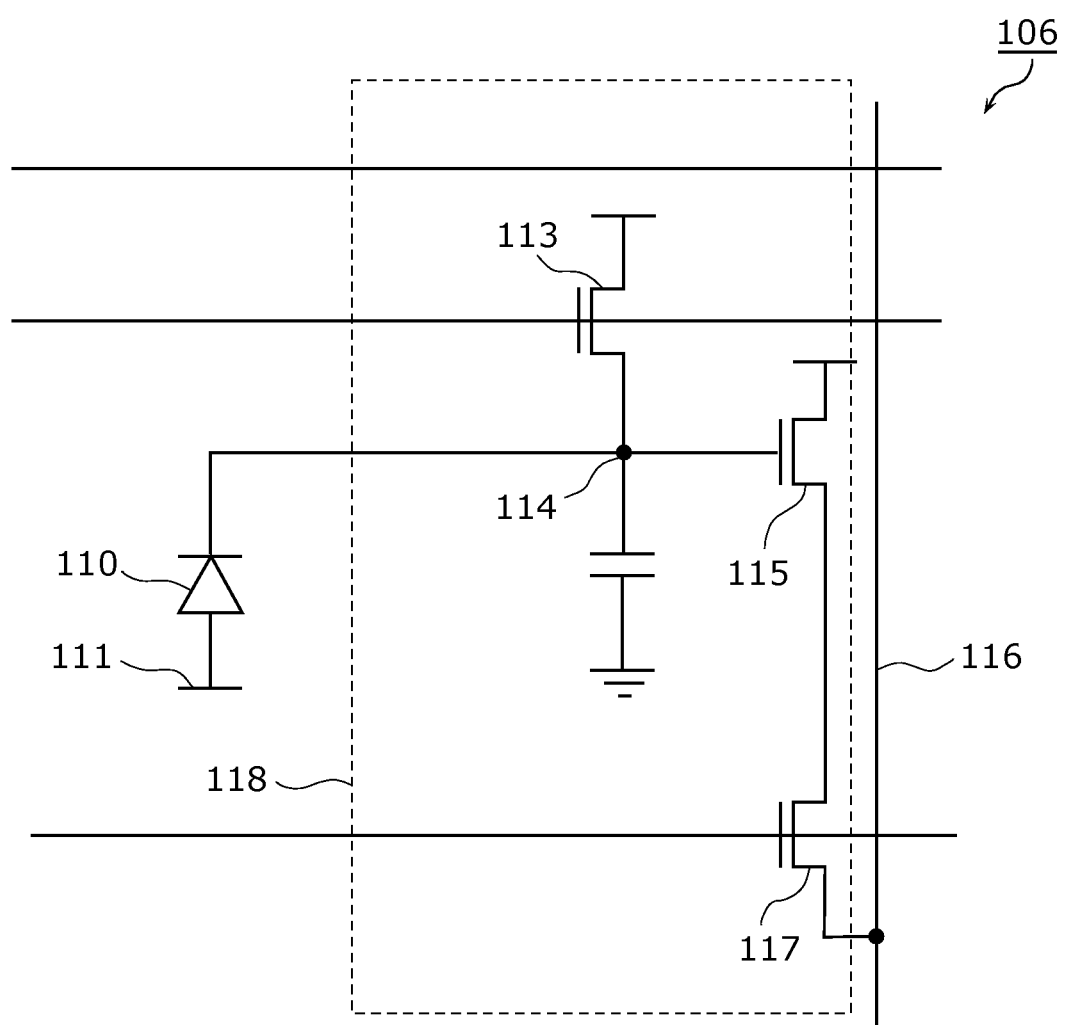
FIG. 2 is a circuit diagram of a pixel according to the first embodiment of the present invention.

FIG. 2 illustrates an example of the circuitry of the pixel 106.

As shown in FIG. 2, the pixel 106 includes a light absorbing layer 110 that generates signal charges by photoelectric conversion, a signal read circuit 118 that selectively reads out to a signal line 116, signal charges generated in the light absorbing layer 110, and a metal layer 111.

Moreover, the signal read circuit 118 includes a reset transistor 113, a floating diffusion 114, an amplifying transistor 115, and a select transistor 117. It should be noted that signal read circuit 118 is not limited to the structure of FIG. 2 and the structure of the signal read circuit 118 does not affect the effects of the invention. For example, the signal read circuit 118 may include a transfer transistor. Moreover, some transistors that constitute the signal read circuit 118 may be shared among pixels.

The floating diffusion 114 is electrically connected to one end of the light absorbing layer 110.

The reset transistor 113 is electrically connected between the floating diffusion 114 and a reset voltage line to which a reset voltage is applied. The on and off of this reset transistor 113 is controlled by the vertical scanning circuit 102. Moreover, turning on the reset transistor 113 resets signal charges accumulated in the pixel 106 (the floating diffusion 114 and the light absorbing layer 110).

The gate of the amplifying transistor 115 is electrically connected to the floating diffusion 114. The amplifying transistor 115 amplifies the voltage of the floating diffusion 114, and outputs the amplified signals to the signal line 116.

The select transistor 117 is electrically connected between the amplifying transistor 115 and the signal line 116. The on and off of this select transistor 117 is controlled by the vertical scanning circuit 102. Moreover, signals amplified by the amplifying transistor 115 are output to the signal line 116 by turning on the select transistor 117.

The metal layer 111 is electrically connected to the other end of the light absorbing layer 110.

The driving circuit 107 switches between the read operations and the reset operations by switching the polarity of a bias voltage applied to the metal layer 111. Of course, the bias voltage applied to this metal layer 111 may be controlled via the vertical scanning circuit 102 or the horizontal scanning circuit 103.

It should be noted that in the pixel 106 shown in FIG. 2, electrons are assumed as signal charges. In this case, the driving circuit 107 applies a negative bias to the metal layer 111 during the read operations. It should be noted that when signal charges are holes, the driving circuit 107 applies a positive bias to the metal layer 111 during the read operations. Thus, the driving circuit 107 generates a potential gradient to collect signal charges in the light absorbing layer 110 by applying a voltage to the metal layer 111.

The following describes the operations of the solid-state imaging device 100.

The light incident on the pixels 106 is photoelectrically converted in the light absorbing layer 110. This generates signal charges. The signal charges are collected at the floating diffusion 114 because of the generation of a potential gradient in the light absorbing layer 110. Here, the potential gradient is generated by applying bias to the metal layer 111. A voltage applied to the gate of the amplifying transistor 115 varies according to the electric charges collected at the floating diffusion 114. The driving circuit 107 controls the horizontal scanning circuits 103 and the vertical scanning circuit 102 to turn on the select transistor 117 of the pixel 106 where signals are to be read out by the X-Y address method. This allows signals amplified by the amplifying transistor 115 to be output to the signal line 116. Moreover, noise contained in the signals is removed by the noise reduction circuit 104, and the noise-removed signals are output to an external device of the solid-state imaging device 100 from the amplifier circuit 105, as video signals.

The structure of the metal layer 111 will be described in detail below.

Figure 3:
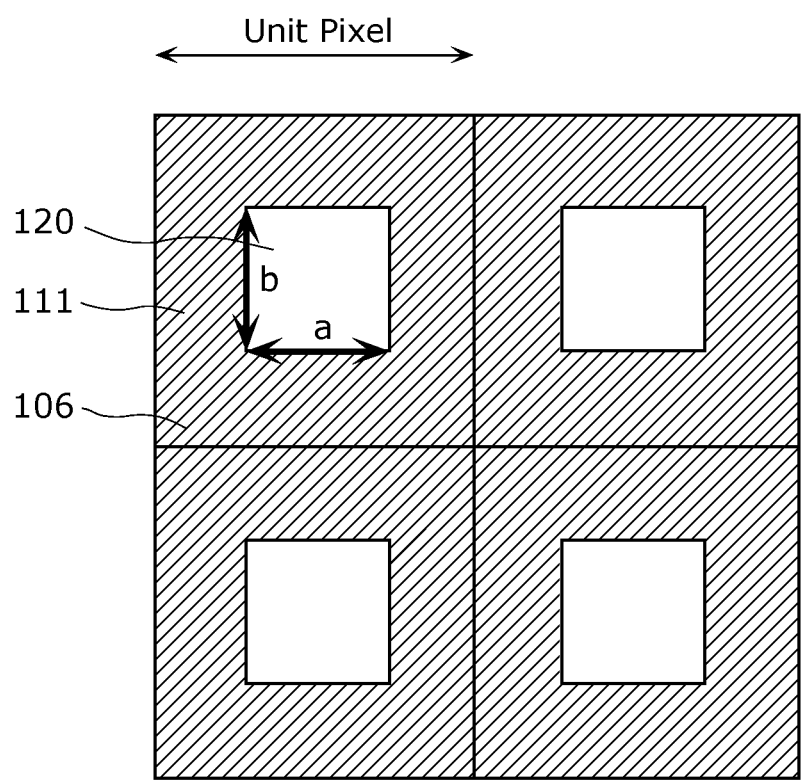
FIG. 3 is a plain view of a metal layer according to the first embodiment of the present invention.

FIG. 3 is a plain view of the metal layer 111 in the pixel 106. The metal layer 111 of each pixel 106 has an aperture 120 right over the light absorbing layer 110. Providing the metal layer 111 with the aperture 120 in such a way allows the metal layer 111 to function as a high pass filter such as a waveguide. This metal layer 111 may be a good conductor metal that is not transparent for a wavelength of light to be received by the solid-state imaging device 100. For example, the metal layer 111 is formed of metal such as aluminum, gold, silver, and copper.

Here, a waveguide will be described below. The waveguide is a pipe that has a hollow structure and the wall surface made of a good conductor, and is generally used for a microwave band transmission line. The waveguide is categorized into, for example, the rectangular waveguide or the circular waveguide, according to the cross-sectional shape of the waveguide. Moreover, the waveguide has a cutoff frequency determined based on the aperture size. In other words, it is generally known that the waveguide has the properties of the high pass filter that signals are not transmitted at a frequency equal to or less than the cutoff frequency.

It should be noted that since not only light in a microwave band used in the waveguide, but also light in the wavelength range dealt by the solid-state imaging device 100 is an electromagnetic wave that follows Maxwell's equations, the light in the wavelength range has similar properties as those of the light in the microwave band.

For example, in a rectangular waveguide having a width a and a height b, a cutoff frequency $f_c$ is expressed by the following expression (1). Moreover, a wavelength $\lambda_c$ corresponding to the cutoff frequency is expressed by the following expression (2). It should be noted that when the interior of the waveguide is filled with a medium in which a transmittance $\epsilon$ and a permeability $\mu$ are isotropic and uniform, a speed v of a plain wave in the medium is expressed by the following expression (3).

[Math. 1]

$$f_c = \frac{v}{2}\sqrt{\left(\frac{l}{a}\right)^2 + \left(\frac{m}{b}\right)^2} \quad \text{(Expression 1)}$$

(*l* and *m* are integral numbers)

[Math. 2]

$$\lambda_c = \frac{v}{f_c} \quad \text{(Expression 2)}$$

[Math. 3]

$$v = \frac{1}{\sqrt{\epsilon\mu}} \quad \text{(Expression 3)}$$

Thus, the wavelength range of light to be transmitted is determined depending on the size of aperture 120 of the waveguide formed of the metal layer 111. Thus, the solid-state imaging device 100 can perform color separation, using the properties of this high pass filter.

To obtain desired filter properties by the expression (2), the largest size of the aperture 120 is smaller than the longest wavelength of light that transmits through the aperture 120 in the metal layer 111. Since the longest wavelength of light received by the solid-state imaging device 100 is up to around 1100 nm, even a minute pixel of less than 1.0 μm can have the necessary size of the aperture 120. Moreover, in a circular waveguide, a cutoff frequency is determined by the size of the aperture 120 as same as the rectangular waveguide. In other words, whether the aperture 120 in the metal layer 111 is square shape or other shape such as polygon, circle or oval, the properties of the high pass filter can be obtained in the same way.

Moreover, although provided in the center of the pixel 106 in FIG. 3, the aperture 120 in the metal layer 111 is not necessarily provided in the center of the pixel 106. For example, spots where light in the pixel 106 is collected may be different between the pixel 106 provided in the center of the pixel array unit 101 and the pixel 106 provided in the periphery of the pixel array unit 101. Thus, the pixel 106 in the center has the aperture 120 in the center, whereas the pixel 106 in the periphery has the metal layer 111 and the aperture 120 away from the center. This allows light to enter the waveguide efficiently.

Moreover, the cutoff frequency of the waveguide slightly changes depending on the incident angle of light incident on the pixel 106. Thus, to respond to this, the size of the aperture 120 may be changed depending on the location of the pixel 106 in the pixel array unit 101.

Moreover, even when this metal layer 111 is not a thick film as the conventional color filter, the metal layer 111 can perform color separation. Moreover, the transmission properties of light equal to or less than a cutoff frequency can be adjusted by changing the film thickness of the metal layer 111. For example, preferably, the film thickness of the metal layer 111 should be from around 0.1 μm to 0.5 μm. This enables good transmission properties.

Furthermore, as the tapered shape aperture 120 in cross section becomes wider or narrower toward the signal read circuit 118, the fall of transmittance near a cutoff frequency can be reduced, thus making it easier to bring filter properties into desired filter properties. In other words, a film that transmits light of a desired wavelength range can be made by optimally designing the film thickness of metal layer 111 that is a thin film and the size and cross-sectional shape of the aperture 120.

For example, when the metal layer 111 is made by a dry etching process using a resist mask and the like, it is possible to easily make a structure in which the aperture 120 in a cross section tapers down toward the signal read circuit 118 by using the tapered shape of the resist mask. Moreover, for example, when the metal layer 111 is made using a damascene process, the metal layer 111 is embedded in a trench provided in a planarization film. Therefore, it is possible to easily make a structure in which the aperture 120 in a cross section widens toward the signal read circuit 118 by using the tapered shape of this trench.

It should be noted that when the aperture 120 in a cross section tapers down toward the signal read circuit 118, it is possible to reduce vignetting of oblique incident light, thus allowing the light absorbing layer 110 to receive a large amount of incident light.

Thus, the solid-state imaging device 100 according to the first embodiment of the present invention does not have to use the conventional color filter, and can reduce the size of a pixel structure. This allows the solid-state imaging device 100 to prevent oblique light from entering adjacent pixels due to a high aspect ratio. Therefore, the solid-state imaging device 100 can improve sensitivity because of the prevention of the oblique light entering and prevent color mixing.

Moreover, since the metal layer 111 that servers as the waveguide and the light absorbing layer 110 are in contact with each other, the light absorbing layer 110 can also receive light that is diffracted in the waveguide. This allows the solid-state imaging device 100 to further prevent the color mixing. Furthermore, since a boundary region between the pixels 106 is covered by the metal layer 111, the boundary region has the effect of light shielding.

Moreover, since the metal layer 111 that has at least one aperture 120 can serve as a waveguide, it is easy to fabricate the solid-state imaging device 100, for example, even when using a minute pixel of around 1.0 μm.

Moreover, even when color images are not captured, a cut filter that blocks infrared light of 750 nm or longer can be made, for example, by setting that a=0.375 μm and b=0.1875 μm in the aperture size in the metal layer 111 so that a wavelength corresponding to a cutoff frequency is 750 nm. Thus, it is unnecessary for the solid-state imaging device 100 according to the first embodiment of the present invention to use an infrared light cut filter provided in the conventional solid-state imaging device. It should be noted that here, the aperture size is set so that a=2b in order to facilitate the excitation of a uniform mode. However, the aperture size is not limited to this size, and a=b may be set, for example.

Figure 4:
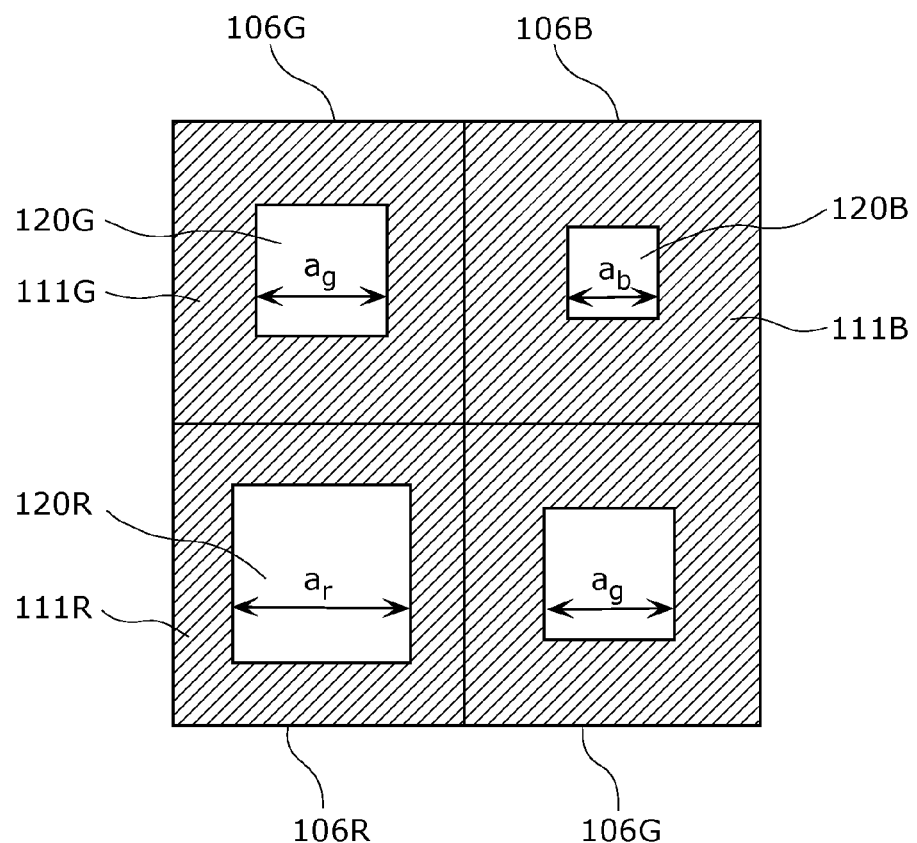
FIG. 4 is a plain view of a metal layer according to the first embodiment of the present invention.

The following describes a method of color separation of original three colors: red, green, and blue (RGB), using a filter formed of the metal layer 111 having the square aperture 120. FIG. 4 is a plain view of the metal layer 111 when the metal layer 111 has different filter properties for each pixel.

Here, each of the pixels 106 provided in the pixel array unit 101 is one of the various types of pixels that convert light of different wavelength ranges into signal charges. Moreover, the shape (aperture ratio) of the aperture 120 is different according to types of pixels. Specifically, each of the pixels 106 is one of a pixel 106R that receives light having red component, a pixel 106G that receives light having green component, and a pixel 106B that receives light having blue component.

As shown in FIG. 4, in the pixel 106R, a size $a_r$ of an aperture 120R is set to be 0.375 μm so that a metal layer 111R blocks light having a wavelength of 750 nm or longer.

Moreover, in the pixel 106G, a size $a_g$ of an aperture 120G is set to be 0.320 μm so that a metal layer 111G blocks light having a wavelength of 640 nm or longer.

Moreover, in the pixel 106B, a size $a_b$ of an aperture 120B is set to be 0.265 μm so that a metal layer 111B blocks light having a wavelength of 530 nm or longer.

Moreover, preferably, the film thicknesses of the metal layers 111R, 111G, and 111B should be around 0.1 μm to 0.7 μm, and this enables to obtain good transmission properties.

Figure 5:
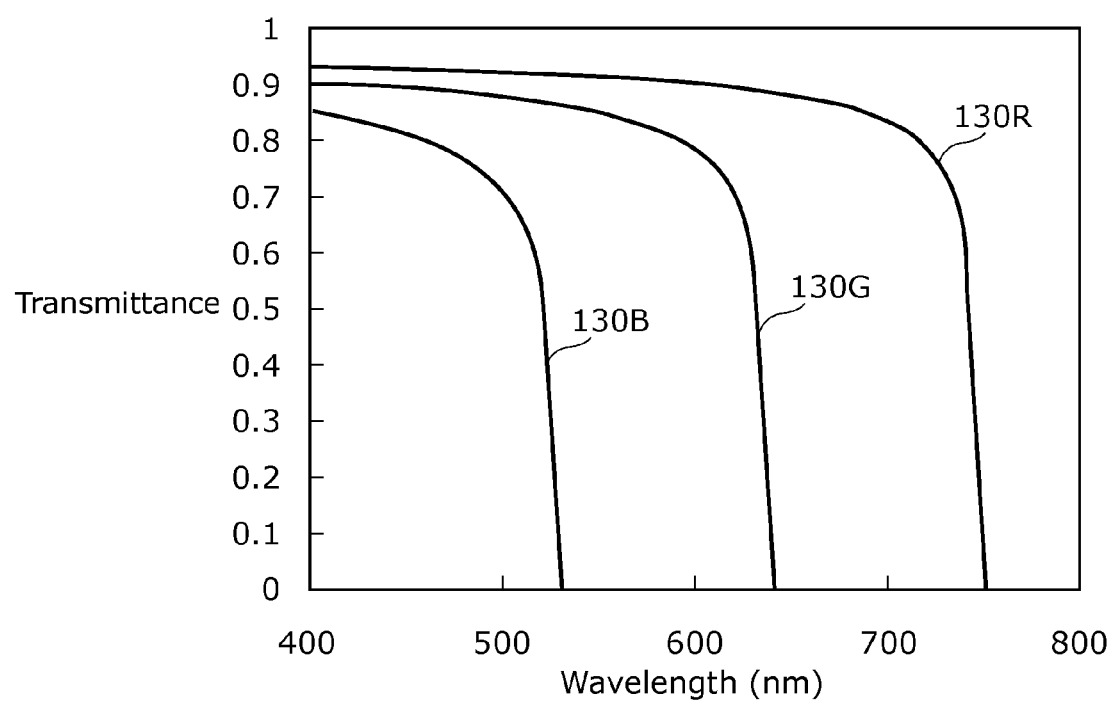
FIG. 5 illustrates the spectral characteristics of a filter of a solid-state imaging device according to the first embodiment of the present invention.

FIG. 5 illustrates the properties of the high pass filters 130R, 130G, and 130B of the metal layers 111R, 111G, and 111B that are obtained at the above-mentioned aperture size.

Practically, the aperture size, film thickness and cross-sectional shape of the metal layer 111 are determined by conducting, based on the target aperture size, tests such as spectrometry and numerical analysis including the finite difference time domain (FDTD) method. It should be noted that even when the size and shape of the aperture 120 are slightly different from designed values due to the processing variability caused during production, big change in a cutoff frequency is rarely seen.

Here, in the above configuration, signal outputs from the pixel 106R include short wavelength light signals other than red signals, signal outputs from the pixel 106G include short wavelength light signals other than green signals, and signal outputs from the pixel 106B include short wavelength light signals other than blue signals. This causes false colors.

To solve this problem, preferably, a matrix operation should be performed on the output signals from the pixels 106R, 106G, and 106B. This matrix operation allows the removal of unnecessary color signals from the outputs of the RGB pixels. Thus, it is possible to extract only the RGB signals. It should be noted that a protective coat such as a silicon nitride film is generally provided on the top surface of the pixel 106. Since short-wavelength light such as ultraviolet light is absorbed by this protective coat, a difference operation does not have to be performed to take into account the amount of the short-wavelength light received by the protective coat.

The cross-sectional structure of the solid-state imaging device 100 will be described below.

Figure 6:
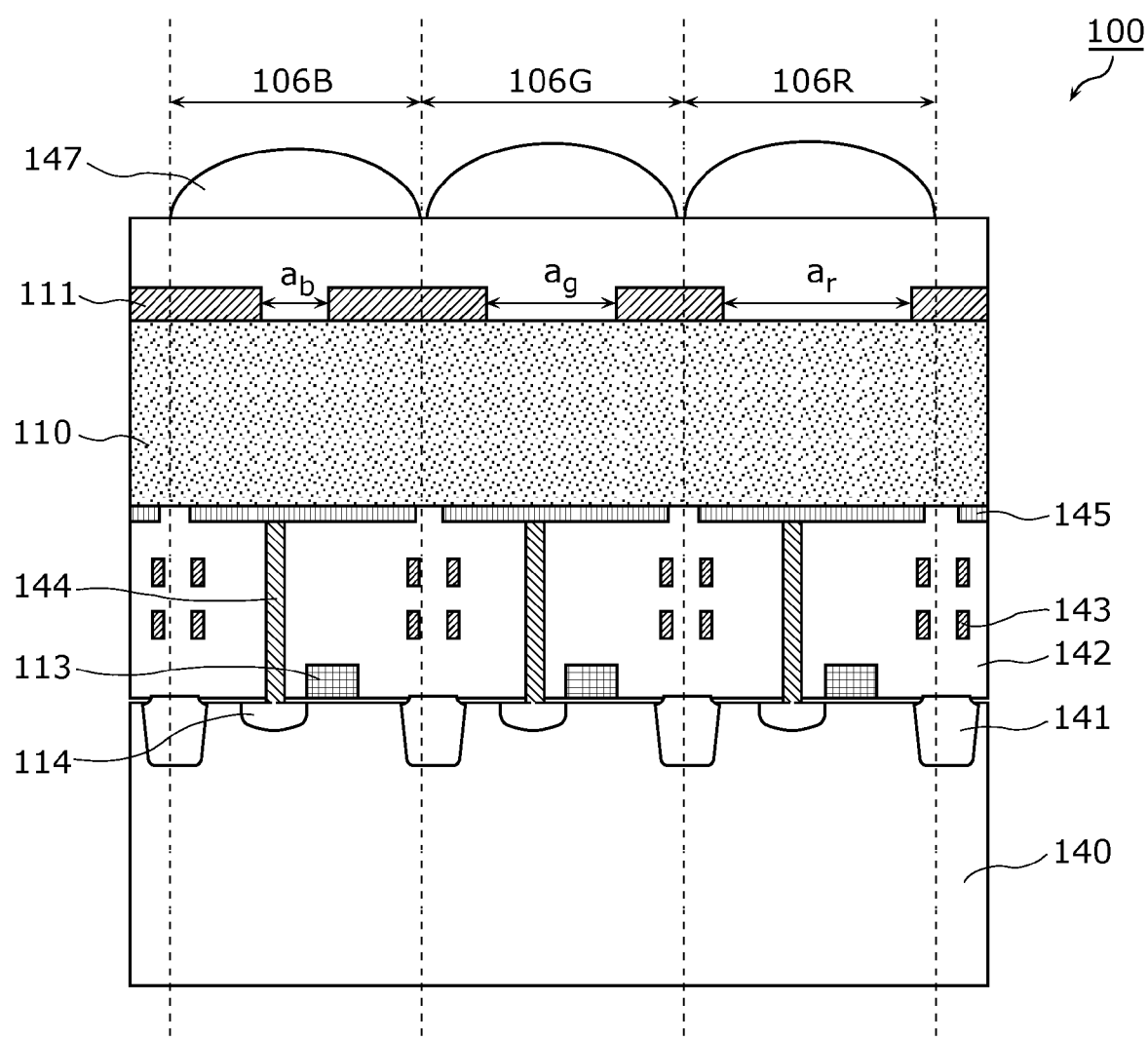
FIG. 6 is a cross-sectional view of a solid-state imaging device according to the first embodiment of the present invention.

FIG. 6 is a cross-sectional view of the pixel 106 in the solid-state imaging device 100 according to the first embodiment of the present invention. As shown in the FIG. 6, the solid-state imaging device 100 further includes a semiconductor substrate 140, device isolation units 141, insulating films 142, wirings 143, contacts 144, electrodes 145, and microlenses 147.

The signal read circuit 118 is formed on the surface of the semiconductor substrate 140 for each pixel 106. It should be noted that as shown in FIG. 2, the signal read circuit 118 includes the floating diffusion 114, the amplifying transistor 115, the reset transistor 113, and the select transistor 117, whereas FIG. 6 only shows the floating diffusions 114 and the gates of the reset transistors 113.

The device isolation unit 141 is formed on the surface of the semiconductor substrate 140. The device isolation units 141 electrically separate the signal read circuits 118 included in the pixels 106.

The insulating film 142 is formed above the semiconductor substrate 140 so as to cover the surface of the semiconductor substrate 140 on which the signal read circuit 118 and the device isolation units 141 are formed.

The wirings 143 are formed inside the insulating films 142, and electrically connect devices included in the signal read circuit 118 and others.

The electrode 145 is formed on the insulating film 142 for each pixel 106.

The contact 144 penetrates the insulating film 142, and electrically connects the floating diffusion 114 and the electrode 145.

The light absorbing layer 110 is formed on the electrodes 145.

The metal layer 111 is formed on the light absorbing layer 110 (light incident plane side). Moreover, the metal layer 111 transmits light of a wavelength range depending on the shape of the aperture 120.

The microlens 147 is formed above the metal layer 111 (light incident plane side) for each pixel 106. The focus of this microlens 147 is in the light absorbing layer 110. Forming such a microlense 147 can improve collection efficiency.

Here, in a minute pixel of around 1.0 μm, it is difficult to maintain sensitivity in the conventional structure using a photodiode formed in a silicon semiconductor substrate. Therefore, to improve an aperture ratio, the solid-state imaging device 100 according to the first embodiment of the present invention uses a structure where the light absorbing layer 110 is formed above the signal read circuit 118.

Moreover, for example, semiconducting crystal, amorphous semiconductor, or organic semiconductor can be used for the light absorbing layer 110. Thus, the light absorbing layer 110 can be easily formed by, for example, vapor deposition. Moreover, for example, an organic semiconductor is a planar organic semiconductor having organic molecular planes layered horizontally. Moreover, the planar organic semiconductor may be a planer organic molecule semiconductor having organic molecular planes arranged vertically.

Moreover, using materials having a light absorbing coefficient higher than that of silicon for the light absorbing layer 110 can also improve sensitivity at a light receiving part. Thus, higher sensitivity can be further expected. For instance, materials having a light absorbing coefficient higher than that of silicon include an organic semiconductor and a compound semiconductor. As mentioned above, in organic semiconductors, good films can be easily stacked by, for example, vapor deposition. On the other hand, in compound semiconductors, it is difficult to stack good crystalline films on the signal read circuit 118. Here, for example, the signal read circuit 118 and a compound semiconductor layer to be the light absorbing layer 110 are formed on separate substrates and the separate substrates are bonded by a substrate bonding technique, so that a structure using the compound semiconductor can be made. For instance, the compound semiconductor layer is composed of layered compound semiconductor crystal such as gallium selenide (GaSe).

Moreover, the light absorbing layer 110 may be formed of at least two conductive semiconductors. For instance, using a p-n junction can facilitate the generation of electric charges by light absorption in a depletion region formed in a junction region. Moreover, using a pin junction can expand a region to generate electric charges, thus allowing sensitivity to be improved.

Moreover, light that transmits through the metal layer 111 is spread by diffraction, and enters the light absorbing layer 110. When the diffracted light reaches adjacent pixels in the light absorbing layer 110, optical color mixing occurs.

Figure 7:
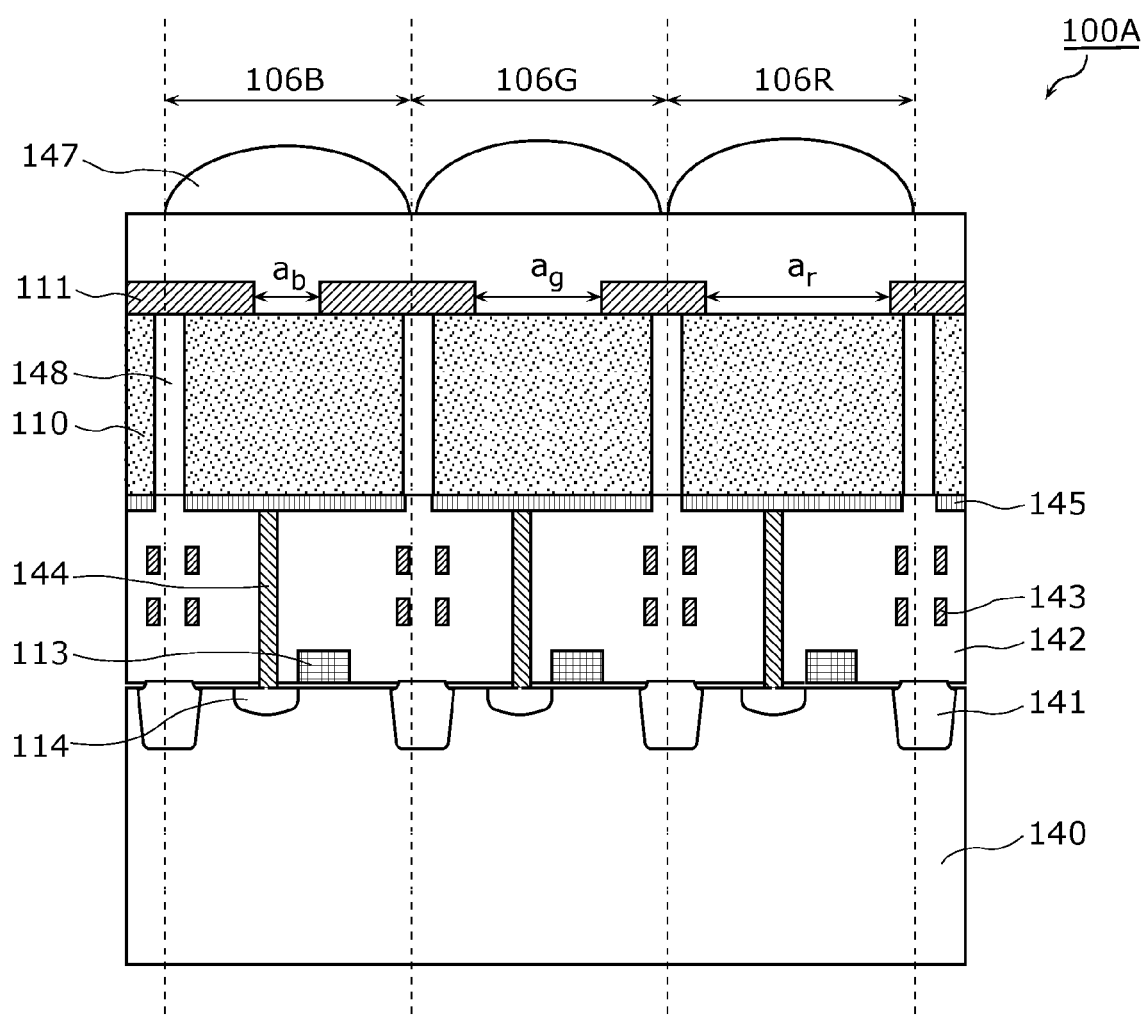
FIG. 7 is a cross-sectional view of a solid-state imaging device according to a modification of the first embodiment of the present invention.

FIG. 7 is a cross-sectional view of a solid-state imaging device 100A that is a modification of the solid-state imaging device 100, and that can prevent this color mixing.

The solid-state imaging device 100A shown in FIG. 7 further includes separations 148, in addition to the configuration of the solid-state imaging device shown in FIG. 6.

The separation 148 electrically separates the light absorbing layers 110 included in the pixels 106. For instance, the separation 148 is a material having a refractive index lower than that of the light absorbing layer 110. Thus, light approaching adjacent pixels reflects due to a refractive index difference at the separation 148. Thus, the solid-state imaging device 100A can prevent optical color mixing. For instance, an insulator including Si or C can be used as a low refractive material. Specifically, SiN, $SiO_2$, SiOF, SiOC, benzocyclobutene (BCB) or others can be used as the low refractive material. It should be noted that the separation 148 may be a trench (air).

Figure 8A:
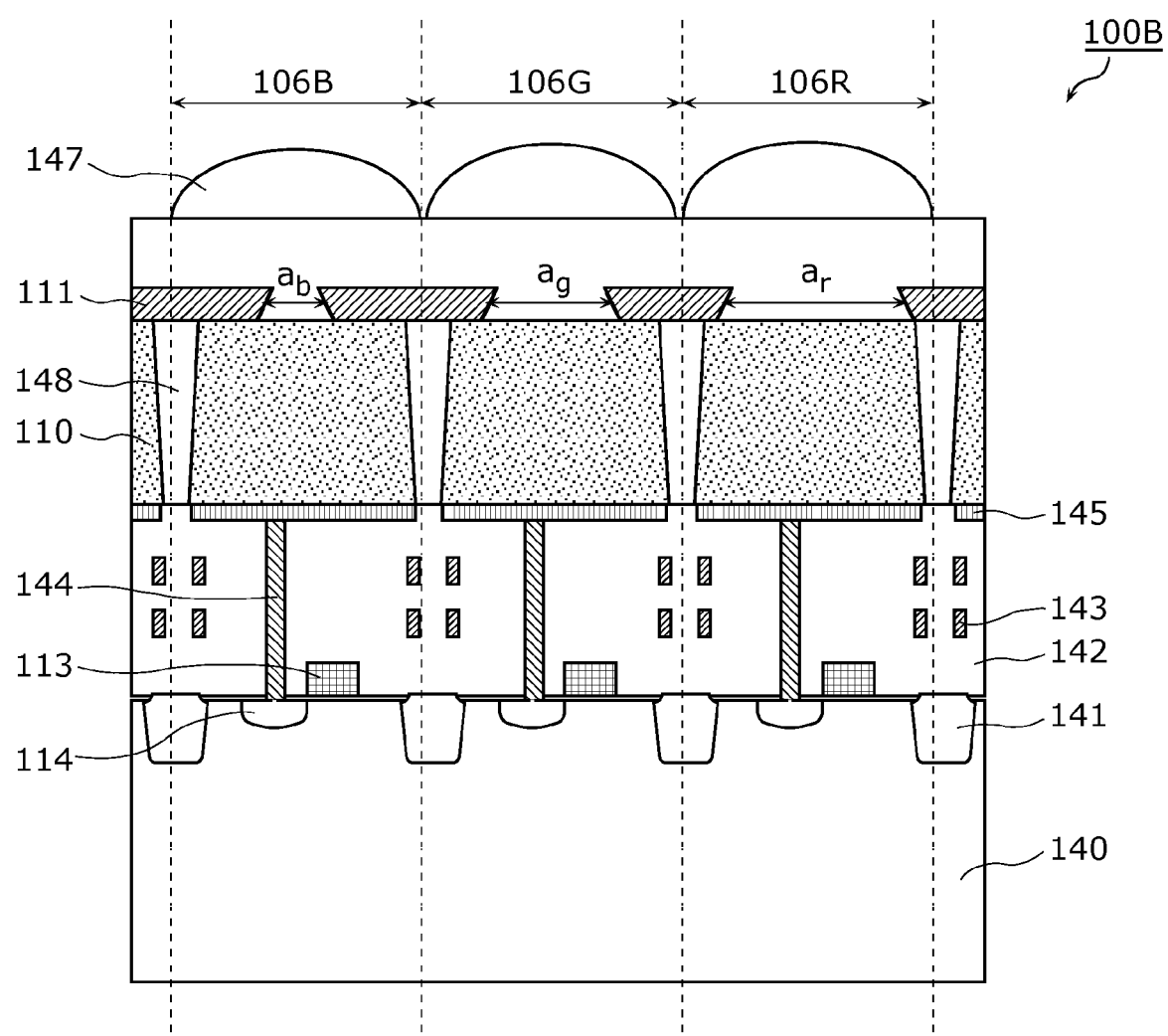
FIG. 8A is a cross-sectional view of a solid-state imaging device according to a modification of the first embodiment of the present invention.
Figure 8B:
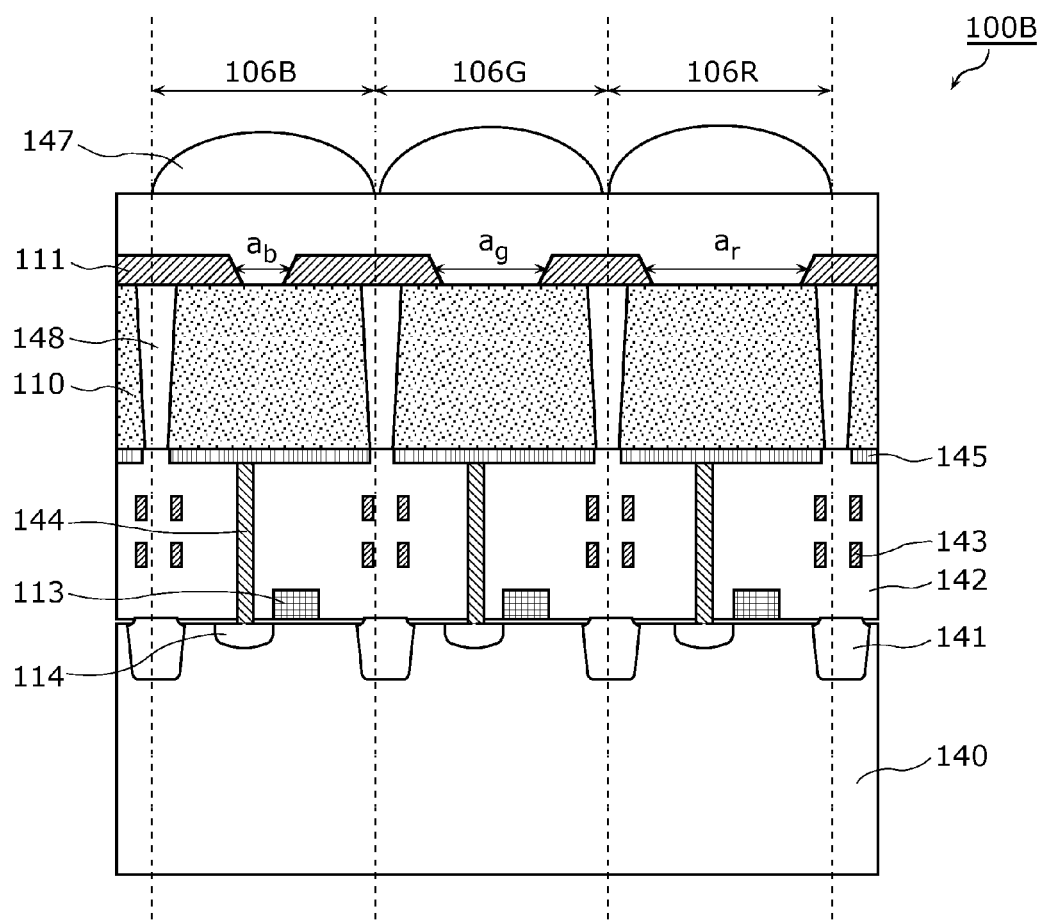
FIG. 8B is a cross-sectional view of a solid-state imaging device according to a modification of the first embodiment of the present invention.

Moreover, FIGS. 8A and 8B are the cross-sectional views of a solid-state imaging device 100B that is a modification of the solid-state imaging device 100A.

In the solid-state imaging device 100B shown in FIG. 8A, the aperture 120 in the metal layer 111 has a tapered shape in a cross section perpendicular to the metal layer 111, and the tapered shape aperture 120 in the cross section perpendicular to the metal layer 111 widens toward the side of the signal read circuit 118. Moreover, in each pixel 106, the light absorbing layer 110 has a tapered shape in a cross section perpendicular to the light absorbing layer 110, and the tapered shape light absorbing layer 110 in the cross section perpendicular to light absorbing layer 110 widens toward the side of the signal read circuit 118.

In the solid-state imaging device 100B shown in FIG. 8A, the aperture 120 in the metal layer 111 has a tapered shape in a cross section perpendicular to the metal layer 111, and the tapered shape aperture 120 in the cross section perpendicular to the metal layer 111 tapers down toward the side of the signal read circuit 118. Moreover, in each pixel 106, the light absorbing layer 110 has a tapered shape in a cross section perpendicular to the light absorbing layer 110, and the tapered shape light absorbing layer 110 in the cross section perpendicular to light absorbing layer 110 widens toward the side of the signal read circuit 118. Thus, the aperture 120 in the metal layer 111 has a tapered shape in a cross section perpendicular to the metal layer 111, so that a transmitted wavelength bandwidth can be easily adjusted. Thus, good color separation can be performed.

It should be noted that since vignetting of oblique incident light can be reduced when the tapered shape shown in FIG. 8B is used, it is possible to receive more incident light than that received when the taper shape shown in FIG. 8A is used.

Embodiment 2

The second embodiment of the present invention describes an example in which the present invention is applied to a backside illumination solid-state imaging device.

Figure 9:
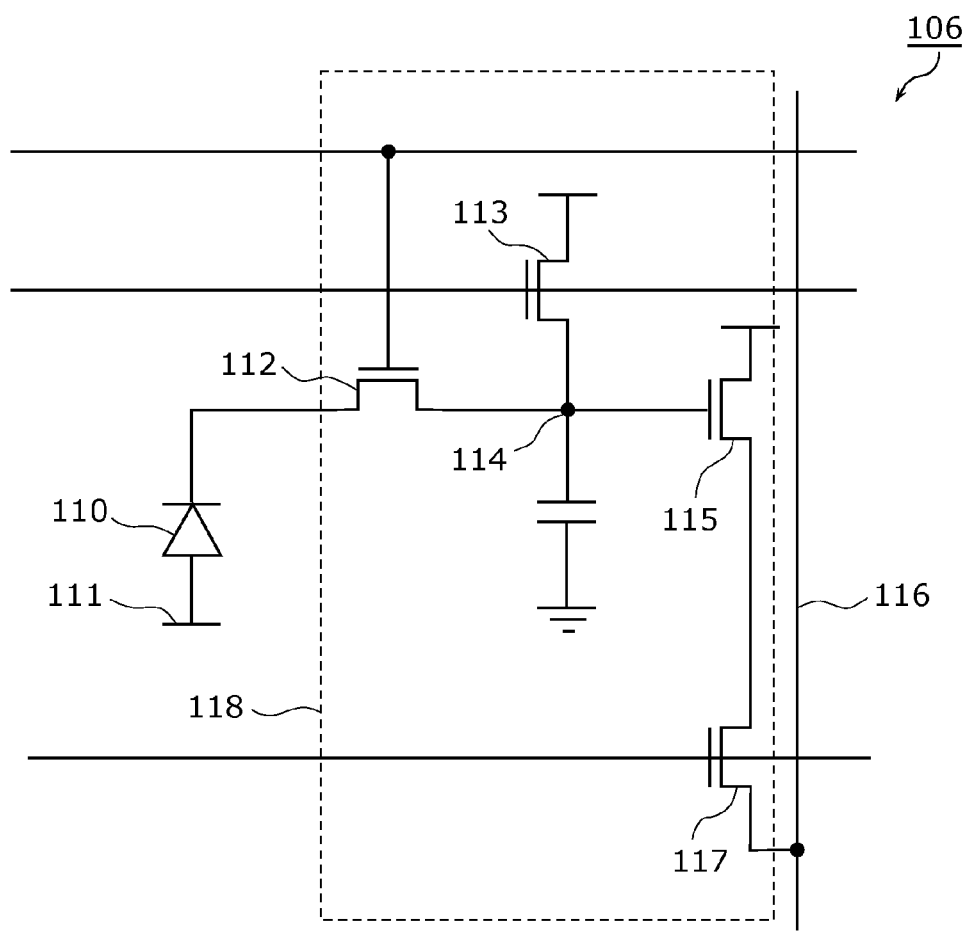
FIG. 9 is a circuit diagram of a pixel according to the second embodiment of the present invention.

FIG. 9 is the circuit diagram of a pixel 106 in a backside illumination solid-state imaging device 100C.

The pixel 106 shown in FIG. 9 further includes a transfer transistor 112 in addition to the configuration of the pixel 106 shown in FIG. 2. It should be noted that a signal read circuit 118 is not limited to the structure shown in FIG. 9 and the structure of the signal read circuit 118 does not affect the effects of the invention. For example, some transistors that constitute the signal read circuit 118 may be shared among pixels.

The transfer transistor 112 is electrically connected between one end of a light absorbing layer 110 and a floating diffusion 114. The on and off of this transfer transistor 112 is controlled by a vertical scanning circuit 102. Moreover, turning on the transfer transistor 112 transfers signal charges accumulated in the light absorbing layer 110 to the floating diffusion 114.

Figure 10:
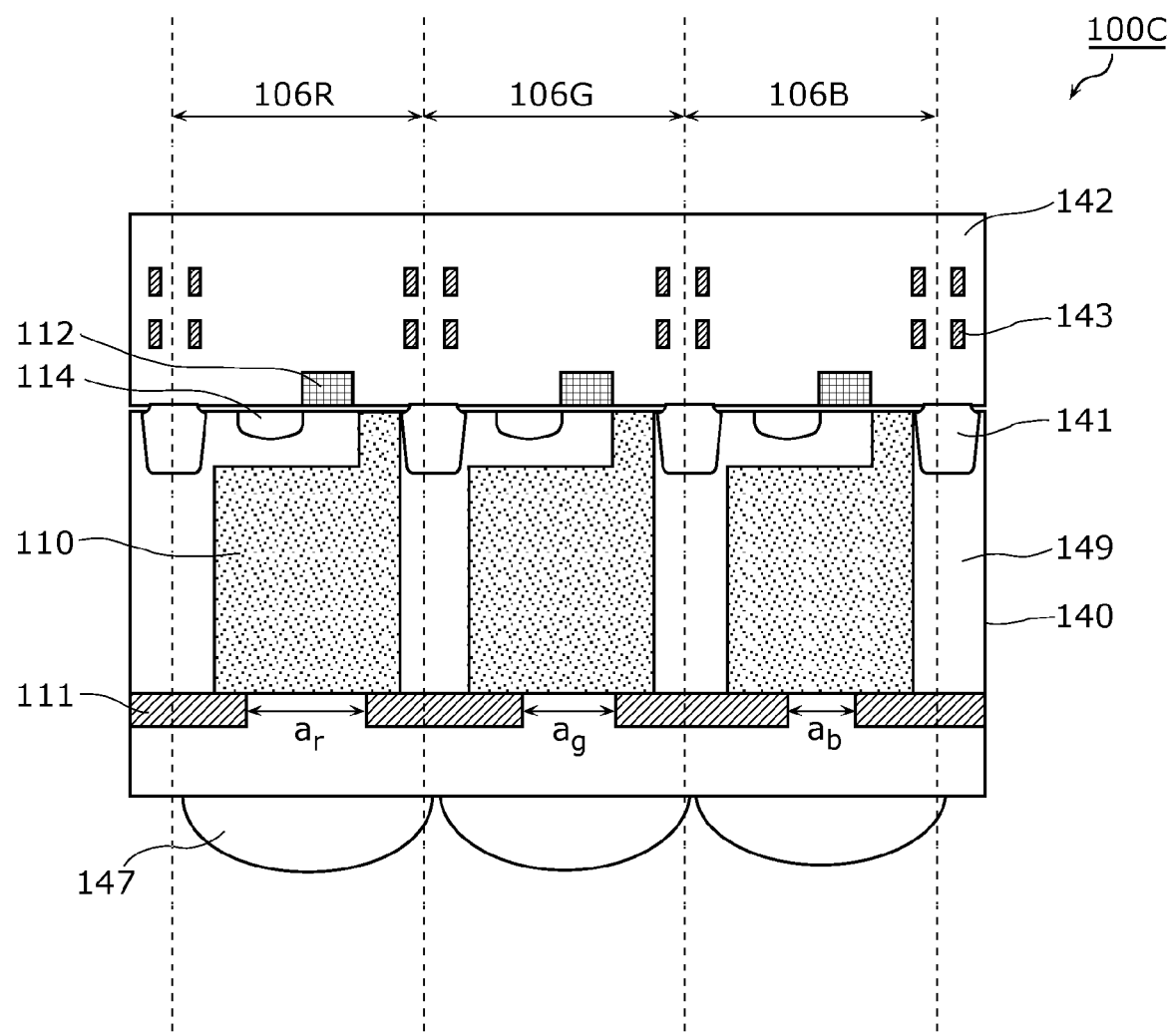
FIG. 10 is a cross-sectional view of a solid-state imaging device according to the second embodiment of the present invention.

FIG. 10 is a cross-sectional view of the solid-state imaging device 100C according to the second embodiment of the present invention.

The solid-state imaging device 100C shown in FIG. 10 is a backside illumination solid-state imaging device in which light enters from a surface opposite to one surface of a semiconductor substrate 140 in which the signal read circuit 118 is formed. Using the backside illumination solid-state imaging device leads to an aperture ratio of almost 100% of light receiving part at a light receiving surface, thus allowing sensitivity to be improved.

The solid-state imaging device 100C shown in FIG. 10 further includes the semiconductor substrate 140, device isolation units 141, an insulating film 142, wirings 143, microlenses 147, and separations 149.

The signal read circuit 118 is formed on one surface of the semiconductor substrate 140 for each pixel 106. It should be noted that FIG. 10 only shows the floating diffusions 114 and the gates of the transfer transistors 112.

The device isolation unit 141 is formed on one surface of the semiconductor substrate 140. This device isolation unit 141 electrically separates the signal read circuits 118 included in the pixels 106.

The insulating films 142 is formed above one surface of the semiconductor substrate 140 so as to cover the one surface of the semiconductor substrate 140 on which the signal read circuits 118 and the device isolation units 141 are formed.

The wiring 143 is formed inside the insulating films 142, and electrically connects devices included in the signal read circuit 118 and others.

The light absorbing layer 110 is formed inside the semiconductor substrate 140.

The metal layer 111 is formed on the backside (other surface side, i.e., light incident plane side) of the light absorbing layer 110.

The microlens 147 is formed on the backside (light incident plane side) of the metal layer 111 for each pixel 106. The focus of this microlens 147 is in the light absorbing layer 110. Forming such a microlense 147 can improve collection efficiency.

Moreover, preferably, the light absorbing layer 110 should be composed of at least two conductive semiconductors. For instance, using a p-n junction can facilitate the generation of electric charges by light absorption in a depletion region formed in a junction region. Moreover, using a pin junction can expand a region to generate electric charge, thus allowing sensitivity to be improved.

Moreover, to prevent color mixing between the light absorbing layers 110 of the pixels 106, preferably, an injection separation 149 should separate the light absorbing layers 110 from each other. The conductivity type of the separation 149 is p type when signal charges are electrons, whereas the conductivity type of the separation 149 is n type when signal charges are electron holes.

Moreover, to improve collection efficiency, preferably, the microlens 147 should be formed above the metal layer 111.

Moreover, operations to read out electric charges from the floating diffusion 114 are the same as those described in the first embodiment.

Moreover, since operations to read out electric charges generated in the light absorbing layer 110 are performed near the gates of the transfer transistors 112, it is necessary to gather electric charges generated in the light absorbing layers 110 at one surface of the semiconductor substrate 140 where the gates of the transfer transistors 112 are formed. Therefore, gradient is given to an impurity concentration distribution so that electric potential becomes deeper toward one surface of the light absorbing layer 110, thus facilitating the gathering of the electric charges. However, in a minute pixel, it is difficult to give gradient to impurity concentration distribution. Thus, in the solid-state imaging device 100C, the metal layer 111 is formed on the backside (light incident plane side), and a bias voltage is applied to the metal layer 111 so as to generate an electric field in the light absorbing layer 110. Thus, electric charges are easily gathered at one surface of the semiconductor substrate 140.

It should be noted that since the configuration and functions of the metal layer 111 are the same as those described in the first embodiment, explanation is omitted here.

Moreover, as same as the first embodiment, a signal output from the pixel 106R includes short wavelength light signals other than red signals, a signal output from the pixel 106G includes short wavelength light signals other than green signals, and a signal output from the pixel 106B includes short wavelength light signals other than other than blue signals. This causes false colors.

Figure 11:
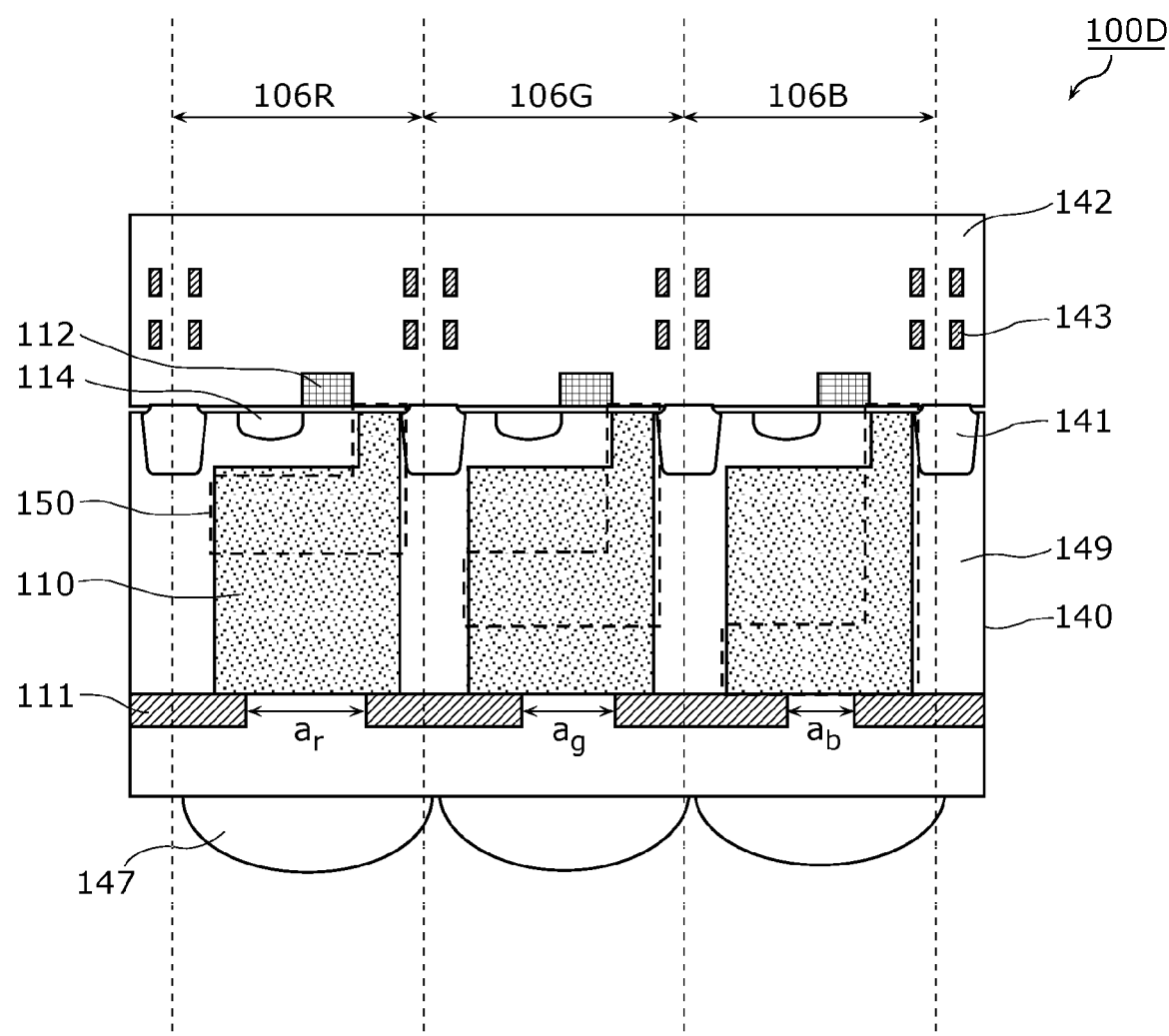
FIG. 11 is a cross-sectional view of a solid-state imaging device according to a modification of the second embodiment of the present invention.

To solve this problem, the depths of depletion regions 150 of the light absorbing layers 110 are adjusted in the solid-state imaging device 100C according to the second embodiment. FIG. 11 is a cross-sectional view of a solid-state imaging device 100D that enables the prevention of false colors.

The depletion region 150 is formed by junctioning two conductive semiconductors. Moreover, light has properties that an absorption coefficient in the light absorbing layer 110 is different according to the wavelength of light. Thus, the position in the depth direction at which the depletion region 150 for absorbing light is formed is adjusted between RGB pixels. While long-wavelength light such as red light reaches the deep region of the light absorbing layer 110, short-wavelength light such as blue light is mostly absorbed in the shallow region of the light absorbing layer 110. Here, the light absorbing layer 110 of the pixel 106R has the depletion region 150 in the deep region so as not to absorb incident light in the shallow region. Thus, the light absorbing layer 110 of the pixel 106R does not absorb green light or blue light that has a wavelength shorter than the wavelength of red light. Therefore, only the red light can be selected as an output signal from the pixel 106R.

Moreover, the light absorbing layer 110 of the pixel 106G has the depletion region 150 in a middle region so as not to absorb incident light in the shallow and deep regions. Thus, the light absorbing layer 110 of the pixel 106G does not absorb blue light having a wavelength shorter than that of the green light, or red light having a wavelength longer than that of green light. Therefore, only the green light can be selected as an output signal from the pixel 106G.

Moreover, the light absorbing layer 110 of the pixel 106B has the depletion region 150 in the shallow region so as not to absorb incident light in the deep region. Thus, the light absorbing layer 110 of the pixel 106B does not absorb red light and green light that have wavelengths longer than the wavelength of blue light. Therefore, only the blue light can be selected as an output signal from the pixel 106B.

For instance, when the thickness of the light absorbing layer 110 is 3.0 µm, for the pixel 106R, the depletion region 150 is formed at a depth of 1.5 to 3.0 µm. For the pixel 106G, the depletion region 150 is formed at a depth of 0.7 to 1.5 µm. For the pixel 106B, the depletion region 150 is formed at a depth of 0.0 to 0.7 µm. Forming the depletion region 150 in such a way enables good color separation.

Moreover, providing the depletion region 150 also in an area where light is shielded by the metal layer 111 can obtain a path by which electric charges generated in the light absorbing layers 110 are transferred to one surface. Moreover, an electric field is likely to generate in this transfer path due to bias applied by the metal layer 111. Thus, the solid-state imaging device 100 D can easily read out electric charges.

This makes it unnecessary for the solid-state imaging device 100 D according to the second embodiment of the present invention to perform the arithmetic processing that is needed in the first embodiment.

Embodiment 3

The third embodiment of the present invention describes a modification of the solid-state imaging device according to the above-mentioned first embodiment.

Figure 12:
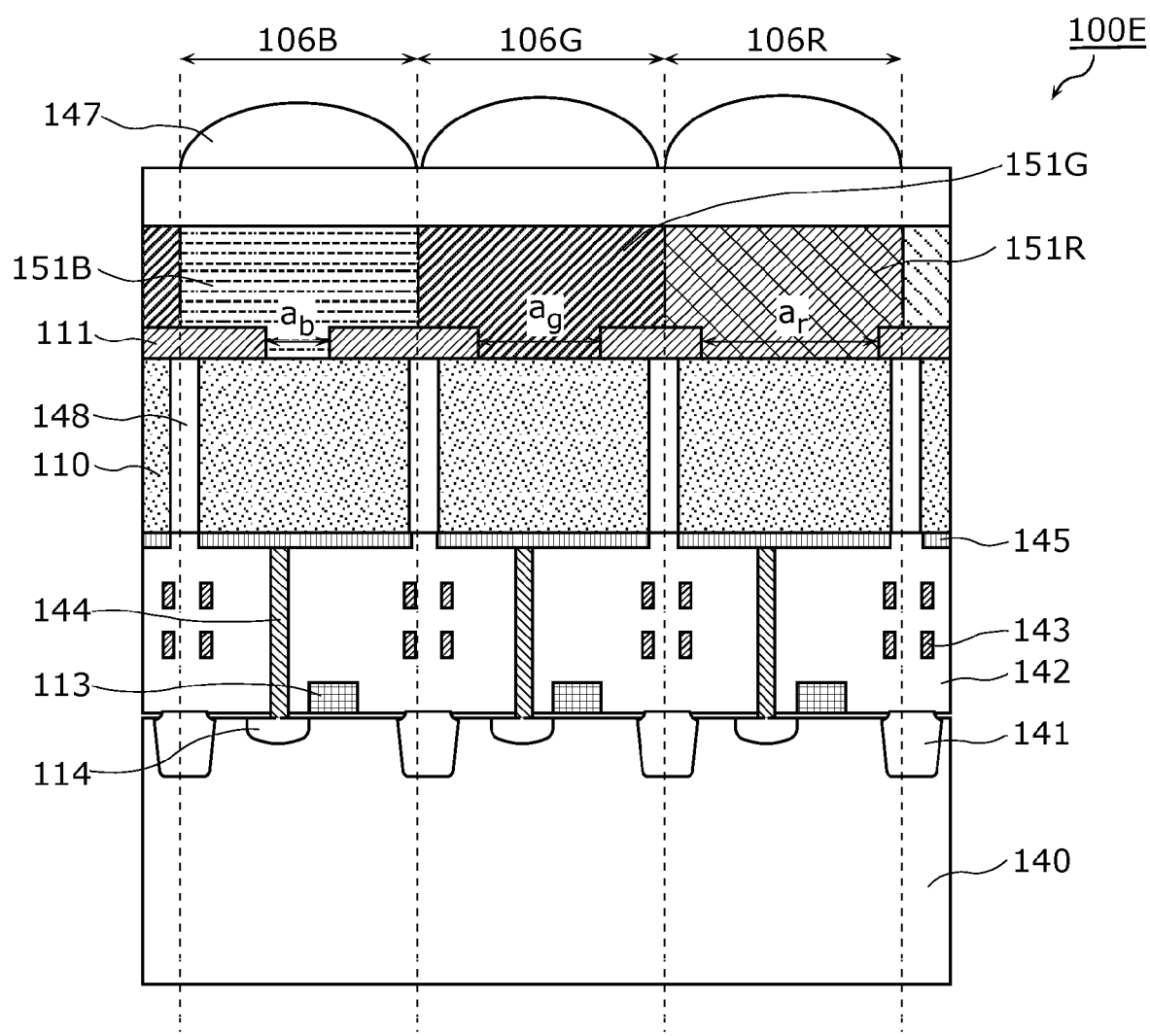
FIG. 12 is a cross-sectional view of a solid-state imaging device according to the third embodiment of the present invention.

FIG. 12 is a cross-sectional view of a solid-state imaging device 100E according to the third embodiment of the present invention.

The solid-state imaging device 100E shown in FIG. 12 includes low pass filters 151R, 151G, and 151B that absorb light of a short wavelength range (high frequency range), in addition to the configuration of the solid-state imaging device 100A shown in FIG. 7.

The low pass filter 151R is formed on the metal layer 111 of the pixel 106R. The low pass filter 151G is formed on the metal layer 111 of the pixel 106G. The low pass filter 151B is formed on the metal layer 111 of the pixel 106B.

Moreover, in the first embodiment, a signal output from the pixel 106R includes short wavelength light signals other than red signals, a signal output from the pixel 106G includes short wavelength light signals other than green signals, and a signal output from the pixel 106B includes short wavelength light signals other than other than blue signals. This causes false colors.

To solve this problem, the solid-state imaging device 100E according to the third embodiment has the low pass filters 151R, 151G, and 151B on the metal layer 111. The low pass filter 151R absorbs light having a wavelength shorter than that of red light. Moreover, the low pass filter 151G absorbs light having a wavelength shorter than that of green light. Moreover, the low pass filter 151B absorbs light having a wavelength shorter than that of blue light.

This allows the pixel 106R to receive only the red light. Moreover, the pixel 106G can only receive green light. Moreover, the pixel 106B can only receive blue light.

This makes it unnecessary for the solid-state imaging device 100E according to the third embodiment of the present invention to use general color filters. It should be noted that since the low pass filters 151R, 151G, and 151B are necessary for the solid-state imaging device 100E, it is inappropriate to reduce the profile of the pixel structure. However, in a minute pixel, when the metal layer 111 that is necessary as a bias application means is used as a waveguide, optical color mixing with adjacent pixels can be reduced without the reduction in profile of the pixel structure. This is because light that passes through the aperture 120 enters the light absorbing layer 110, and the areas outside the aperture 120 are covered by the metal layer 111. Moreover, since the metal layer 111 and the light absorbing layer 110 are in contact with each other, the light absorbing layer 110 can receive light that is diffracted in the waveguide. This can prevent color mixing.

It should be noted that in FIG. 12, although the low pass filters 151R, 151G, and 151B are formed both in the apertures 120 and on the metal layers 111, the low pass filters may be formed either in the apertures 120 or on the metal layers 111.

Although the solid-state imaging devices according to the embodiments of the present invention are described, the present invention is not limited to these embodiments.

For instance, in the above drawings, the corners and sides of structural elements are described linearly. However, the present invention includes corners and sides that are rounded for production reasons.

Moreover, at least parts of the solid-state imaging device according to the first to third embodiments and the configurations or functions of modifications thereof may be combined.

Moreover, the number used above is provided to specifically describe the present invention as examples, and the present invention is not limited to the exemplified number. Moreover, materials of the structural elements mentioned above are provided as examples to specifically describe the present invention, the present invention is not limited to the exemplified materials.

Moreover, although MOS transistors are used in the above description, other transistors such as bipolar transistors may be used.

Moreover, the solid-state imaging devices according to the embodiments are typically achieved as a LSI that is an integrated circuit. The solid-state imaging devices can be in multiple single-function LSIs, or also can be in one integrated LSI.

Moreover, ways to achieve circuit integration are not limited to the LSI, and a special circuit or a general purpose processor may also achieve the integration. Field Programmable Gate Array (FPGA) that can be programmed after manufacturing LSI or a reconfigurable processor that allows re-configuration of the connection or configuration of a circuit cell in LSI can be used.

Moreover, processors such as CPU may execute a program to achieve a part of the functions of the solid-state imaging devices according to the embodiments of the present invention.

Moreover, the present invention may be the above program or a recording medium on which the above program is recorded. Moreover, needless to say, the above program can be distributed via transmission media such as the Internet.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The present invention can be used for, for example, high resolution cameras for cellular phones, DSCs, and HD movie cameras.

The invention claimed is:

1. A solid-state imaging device comprising
pixels which are arranged two-dimensionally and each of which includes:

a light absorbing layer that converts light into signal charges;

a signal read circuit that reads out the signal charges, the signal read circuit being formed on a side opposite to a light incident plane side of the light absorbing layer;

a metal layer that is formed on the light incident plane side of the light absorbing layer, the metal layer having an aperture to transmit, into the light absorbing layer, light of a wavelength range depending on a shape of the aperture, a driver that applies a voltage to the metal layer to generate, in the light absorbing layer, a potential gradient to collect the signal charges.

2. The solid-state imaging device according to claim 1, wherein the driver applies a voltage to the metal layer to switch between an accumulation operation, a read operation, and a reset operation for the signal charges.

3. The solid-state imaging device according to claim 1, wherein each of the pixels is one of various types of pixels that convert light of different wavelength ranges into the signal charges, and the shape of the aperture formed in the metal layer varies according to the types of the pixels.

4. The solid-state imaging device according to claim 1, wherein the aperture has a tapered shape in a cross section perpendicular to the metal layer.

5. The solid-state imaging device according to claim 1, wherein each of the pixels further includes a filter that is formed at least above or in the aperture, the filter blocking light of a wavelength range shorter than the wavelength range depending on the shape of the aperture.

6. The solid-state imaging device according to claim 1, wherein each of the pixels further includes a microlens formed on the light incident plane side of the aperture, and a focus of the microlens is in the light absorbing layer.

7. The solid-state imaging device according to claim 1 comprising a semiconductor substrate, wherein the light absorbing layer is formed in the semiconductor substrate, the signal read circuit is formed on a first surface side of the semiconductor substrate, and the metal layer is formed on a second surface side of the semiconductor substrate opposite to the first surface side, and transmits, into the light absorbing layer, light of the wavelength range depending on the shape of the aperture among incident light from the second surface side.

8. The solid-state imaging device according to claim 1 comprising a semiconductor substrate, wherein the signal read circuit is formed on a first surface side of the semiconductor substrate, the light absorbing layer is formed above the signal read circuit and formed on the first surface side, and the metal layer is formed above the light absorbing layer and formed on the first surface side, and transmits, into the light absorbing layer, light of the wavelength range depending on the shape of the aperture among incident light from the first surface side.

9. The solid-state imaging device according to claim 1, further comprising a separation that electrically separates the light absorbing layer included in each of the pixels, from the light absorbing layer included in another one of the pixels, the separation being formed of a material having a refractive index lower than a refractive index of the light absorbing layer.

10. The solid-state imaging device according to claim 1, wherein the light absorbing layer is formed of a planar organic semiconductor, and the planar organic semiconductor includes organic molecular planes layered horizontally.

11. The solid-state imaging device according to claim 1, wherein the light absorbing layer is formed of a planar organic molecule semiconductor, and the planar organic molecule semiconductor includes organic molecular planes arranged vertically.

12. The solid-state imaging device according to claim 1, wherein the light absorbing layer is formed of at least two types of conductive semiconductors having different spectral characteristics.

13. The solid-state imaging device according to claim 3, wherein the light absorbing layer is formed of at least two types of conductive semiconductors having different spectral characteristics, and a position in the depth direction of a depletion region varies according to types of the pixels, the depletion region being formed by junctioning the two types of the conductive semiconductors.

* * * * *